(12) United States Patent
Leussler et al.

(10) Patent No.: US 11,112,471 B2
(45) Date of Patent: Sep. 7, 2021

(54) INDUCTIVELY FEEDING AN RF COIL FOR MAGNETIC RESONANCE IMAGING

(71) Applicant: KONINKLIJKE PHILIPS N.V., Eindhoven (NL)

(72) Inventors: Christoph Leussler, Hamburg (DE); Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 127 days.

(21) Appl. No.: 16/479,955

(22) PCT Filed: Jan. 30, 2018

(86) PCT No.: PCT/EP2018/052192
§ 371 (c)(1),
(2) Date: Jul. 23, 2019

(87) PCT Pub. No.: WO2018/141703
PCT Pub. Date: Aug. 9, 2018

(65) Prior Publication Data
US 2019/0339345 A1      Nov. 7, 2019

(30) Foreign Application Priority Data

Jan. 31, 2017  (EP) .................................... 17153857

(51) Int. Cl.
*G01R 33/36* (2006.01)
*G01R 33/34* (2006.01)

(52) U.S. Cl.
CPC ... *G01R 33/3628* (2013.01); *G01R 33/34076* (2013.01)

(58) Field of Classification Search
CPC ................. G01R 33/34076; G01R 33/3628
See application file for complete search history.

(56) References Cited

U.S. PATENT DOCUMENTS

| 5,477,145 A | 12/1995 | Takahashi et al. |
| 6,297,636 B1 | 10/2001 | Shimo et al. |

(Continued)

OTHER PUBLICATIONS

Ballon et al "A 64 Mhz Half-Birdcage Resonantor for Clinical Imaging" Journal for Magnetic Resonance, vol. 90, No. 1, Oct. 15, 1990 p. 131-140.

(Continued)

*Primary Examiner* — Gregory H Curran

(57) ABSTRACT

The present invention is directed to inductively feeding a RF coil (9) for magnetic resonance imaging (MRI), and in particular to a system comprising a RF coil (9) for magnetic resonance imaging and at least one feeding coil (14) for inductively feeding the RF coil (9) with an RF signal, and further to a method for inductively feeding a RF coil (9) for magnetic resonance imaging with at least one RF signal. According to the invention, in this system, the at least one feeding coil (14) is configured and arranged for feeding the RF signal into a conductive coil element (10) of the RF coil (9) at a first position and at a second position, the first position being different from the second position, wherein the direction of the magnetic field of the RF signal at the first position is different from the magnetic field of the RF signal at the second position. In this way, the invention provides for an inductive RF feeding of a resonator which can be achieved in a compensated way, i.e. the local RF field of the feeding loop can be compensated at distant locations. Moreover, the directions of the magnetic fields can be adapted to the respective direction of the magnetic field surrounding the coil element (10) at the respective feeding location. In this way, the invention enables to improve the power efficiency of an RF coil.

20 Claims, 6 Drawing Sheets

(56) References Cited

U.S. PATENT DOCUMENTS

| | | |
|---|---|---|
| 2002/0145427 A1 | 10/2002 | Wong et al. |
| 2004/0155656 A1 | 8/2004 | Leussler |
| 2009/0009169 A1 | 1/2009 | Schulz |
| 2009/0189609 A1 | 7/2009 | Eberler et al. |
| 2013/0271135 A1* | 10/2013 | Ozen ................ G01R 33/3657 324/309 |
| 2014/0103931 A1* | 4/2014 | Soutome ................ A61B 5/055 324/322 |
| 2014/0145722 A1 | 5/2014 | Suzuki |
| 2014/0218035 A1 | 8/2014 | Okamoto |
| 2015/0137807 A1 | 5/2015 | Hu et al. |
| 2016/0187434 A1 | 6/2016 | Boskamp |
| 2016/0238678 A1 | 8/2016 | Eberler |
| 2017/0307704 A1 | 10/2017 | Leussler et al. |
| 2017/0359034 A1* | 12/2017 | Hussein ................ H03F 3/245 |

OTHER PUBLICATIONS

International Search Report From PCT/EP2018/052192 dated May 7, 2018.

C. Findeklee et al "Highly Efficient Inductively Coupled Double Resonant Surface Coil for Simultaneous 1H/19F PET-MRI", ISMRM 2013, p. 828.

H. Celik et al "Inductively Coupled Birdcage Coil" Proc. Intl.Soc. Mag. Reson. Med. 18 (2010 p. 3901.

\* cited by examiner

INDUCTIVELY FEEDING AN RF COIL FOR MAGNETIC RESONANCE IMAGING

CROSS REFERENCE TO RELATED APPLICATIONS

This application is a U.S. national phase application of International Application No. PCT/EP2018/052192 filed on Jan. 30, 2018, which claims the benefit of EP Application Serial No. 17153857.2 filed on Jan. 21, 2017 and is incorporated herein by reference.

FIELD OF THE INVENTION

The invention relates to the field of inductively feeding a radio frequency (RF) coil for magnetic resonance imaging (MRI), and in particular to a system comprising a RF coil for magnetic resonance imaging and at least one feeding coil for inductively feeding the RF coil with an RF signal, and further to a method for inductively feeding a RF coil for magnetic resonance imaging with at least one RF signal.

BACKGROUND OF THE INVENTION

As is generally known in the art, in an MRI system, an examination object, usually a patient, is exposed to a uniform main magnetic field (B0 field) so that the magnetic moments of the nuclei within the examination object form a certain net magnetization of all nuclei parallel to the B0 field, which can be tilted leading to a rotation around the axis of the applied B0 field (Larmor precession). The rate of precession is called Larmor frequency which is dependent on the specific physical characteristics of the involved nuclei, namely their gyromagnetic ratio, and the strength of the applied B0 field. The gyromagnetic ratio is the ratio between the magnetic moment and the spin of a nucleus.

By transmitting an RF excitation pulse (B1 field) which is orthogonal to the B0 field, generated by means of an RF transmitting antenna or coil, and matching the Larmor frequency of the nuclei of interest, the spins of the nuclei can be excited and brought into phase, and a deflection of their net magnetization from the direction of the B0 field is obtained, so that a transversal component in relation to the longitudinal component of the net magnetization is generated.

After termination of the RF excitation pulse, the relaxation processes of the longitudinal and transversal components of the net magnetization begin, until the net magnetization has returned to its equilibrium state. MR (magnetic resonance) signals which are generated by the precessing magnetization, are detected by means of an RF receiving antenna or coil. The received MR signals which are time-based amplitude signals, are then Fourier transformed to frequency-based MR spectrum signals and processed for generating a MR image of the nuclei of interest within the examination object. In order to obtain a spatial selection of a slice or volume within the examination object and a spatial encoding of the received MR signals emanating from a slice or volume of interest, gradient magnetic fields are superimposed on the B0 field, having the same direction as the B0 field, but having gradients in the orthogonal x-, y- and z-directions. Due to the fact that the Larmor frequency is dependent on the strength of the magnetic field which is imposed on the nuclei, the Larmor frequency of the nuclei accordingly decreases along and with the decreasing gradient (and vice versa) of the total, superimposed B0 field, so that by appropriately tuning the frequency of the transmitted RF excitation pulse (and by accordingly tuning the resonance frequency of the RF/MR receive antenna), and by accordingly controlling the gradient magnetic fields, a selection of nuclei within a slice at a certain location along each gradient in the x-, y- and z-direction, and by this, in total, within a certain voxel of the object can be obtained.

The above described RF (transmitting and/or receiving) antennas can be provided in the form of so-called body coils which can be fixedly mounted within an examination space of an MRI system for imaging a whole examination object, or which are arranged directly on or around a local zone or area to be examined. The invention is about the feeding of such a body coil for MRI. As described above, such a body coil is a resonant antenna, designed for generating a well-defined magnetic field inside the human body.

As a side effect, electric fields are causing losses which strongly change the input impedance of a RF coil. This mainly effects the real part of the impedance, the relative change is linked to the resonance quality factor change, also called the load factor. This is typically in the range of 3 to 5 for conventional birdcage resonators which are the preferred implementation for MRI body coils.

Birdcage resonators typically comprise two end rings comprised of two circular conductive loops which are connected with each other by a plurality of conductive straight rungs. Usually, an even number of rungs is provided which ranges from 4 to 32 depending on the size of the body coil. Birdcage resonators usually contain capacitors between conducting elements variably arranged based on the frequency characteristics desired. In clinical MRI a high-pass configuration is generally used with pairs of capacitors located along the end rings. Together, this design approximates a continuous conducting surface. Other designs in MRI scanners have a bandpass structure. The ratio of ring-to rung capacitors defines a high pass or low pass mode spectra. A certain capacitor ratio leads to degeneration of adjacent mesh loops of the birdcage resonator.

The power fed into a RF coil is typically generated by pulsed amplifiers which demand a good or at least acceptable power matching at their output. In quadrature operation, this is typically realized by using a hybrid coupler to drive two quadrature channels of the coil simultaneously. Such a coupler is typically a 4-port coupler which has the coil feeding ports connected to its outputs, the amplifier at one input and a load, typically 50 Ohm, matching the transmission line impedance, connected to the fourth port. This is realized for MRI scanners at 1.5 T (63.8 MHz) and below. At higher field strength, the fixed phase relationship of 90 deg is a disadvantage for field B1 homogeneity, so that each individual port is driven independently by individual TX channels (individual amplitude, phase, frequency, arbitrary transmit pulse).

Conventional birdcage resonators are directly fed at the coil ports using matching circuits. In this respect, RF feeding the ring of the birdcage can be realized using single loop inductive feeding. These single loops usually generate the additional transversal B1 field and, thus, distort the transversal B1 field of the birdcage resonator which means that the strength of the B1 field of the birdcage resonator is decreased or increased depending on the phase of the loop current, respectively.

From US 2014/0218035 A1 a power transmitting unit to wirelessly transmit electric power to an RF coil, especially a local birdcage head coil, is known. The magnetic resonance signal detected by this RF coil is digitized and wirelessly transmitted by consuming the electrical power from the power transmitting unit. Therefore, this RF coil is a coil which has a digitizer and a wireless signal transmitter on board, wherein the wireless signal transmission is electrically powered by the power transmitting unit. The electrical power is provided in a wireless manner. As an embodiment of the power transmitting unit a figure-eight coil is described. This figure-eight coil provides wireless power to the on-board digitizer and for the transmission of the digitized magnetic resonance signal. Further, this birdcage head coil is energized by a quadrature system that feeds a pair of rungs at a $\pi/2$ relative orientation. The U.S. Pat. No. 5,477,145 which shows a multiple element resonator (MER) for an MRI apparatus. Feed/reception of the resonator is effected by inductive coupling through a pick-up coil.

SUMMARY OF THE INVENTION

It is an object of the invention to feed a RF coil for magnetic resonance imaging with an RF signal with reduced distortion of the transversal B1 field of the RF coil.

This object is achieved by a system comprising a RF coil for magnetic resonance imaging and at least one feeding coil for inductively feeding the RF coil with an RF signal, wherein the RF coil comprises conductive coil elements, and the at least one feeding coil is configured and arranged for feeding the RF signal into a coil element of the RF coil at a first position and at a second position, the first position being different from the second position, wherein the direction of the magnetic field of the RF signal at the first position is different from the magnetic field of the RF signal at the second position.

Therefore, the invention proposes an inductive RF feeding of a RF coil which can be achieved in a compensated way, i.e. the local RF field of the feeding loop can be compensated at distant locations. Moreover, the directions of the magnetic fields can be adapted to the respective directions of the magnetic field surrounding the coil element at the respective feeding location, respectively. In this way, the invention enables to improve the power efficiency of the RF coil.

The present invention may be applied to a variety of RF coils for a magnetic resonance examination system. The RF coil may be of a birdcage configuration of parallel rungs coupled to end rings. The RF coil may be of a TEM configuration of parallel rungs without end rings. Moreover, the invention will work for RF coils of various sizes, such as an RF body coil or a local RF coil, for example a birdcage resonator RF head coil.

According to a preferred embodiment of the invention, the coil elements of the boy coil include two end rings comprised of two circular conductive loops which are connected with each other by a plurality of conductive straight rungs. As already mentioned above, RF coils for magnetic resonance imaging with coil elements including two end rings comprised of two circular conductive loops which are connected with each other by a plurality of conductive straight rungs are also called birdcage resonators.

While certain compensation effects at distant locations can already be achieved without an antiparallel arrangement of the magnetic fields at the first and second position, respectively, according to a preferred embodiment of the invention, the direction of the magnetic field of the RF signal at the first position is opposite (antiparallel) to the magnetic field of the RF signal at the second position. In this way, practically a total compensation of the magnetic fields generated by the feeding coil in the far field can be achieved.

The RF signal can be fed into the RF coil in different ways. According to a preferred embodiment of the invention, the at least one feeding coil is configured and arranged for feeding the RF signal into the RF coil at two opposite sides of the coil element. In this regard, it is further preferred that the coil element comprises a lateral contraction and the at least one feeding coil is configured and arranged for feeding the RF signal into the RF coil at the lateral contraction. In this way, the lateral dimensions of the arrangement for feeding the RF signal into the RF coil can be kept small.

Alternatively, according to a preferred embodiment of the invention, in a section of the coil element the coil element is split into two different coil element lines, the two different coil element lines crossing each other at a crossing point with not galvanic contact to each other, wherein the at least one feeding coil is configured and arranged for feeding the RF signal into both coil element lines at two opposite sides of the crossing point. Such a solution may also serve for a compact design of the arrangement since at the crossing point of the two different coil element lines the lateral dimensions of the coil element are reduced, too.

According to another preferred embodiment of the invention, the coil element comprises a recess, the recess dividing the coil element into two coil element lines which are spaced apart from each other, wherein the at least one feeding coil is configured and arranged for feeding the RF signal into both coil element lines. In this regard, it is further preferred that the at least one feeding coil is configured and arranged for feeding the RF signal into both lines of the RF coil inside the recess. Instead of feeding two RF signals with opposite magnetic field directions on opposite sides of the coil element, in this way a respective feeding of theses RF signals into the coil element is achieved inside the recess at the right and left coil element line, respectively. Similar to the embodiments described before, such a solution may also serve for a compact design.

With respect to the feeding coil itself, the invention allows for different designs. According to a preferred embodiment of the invention, the feeding coil comprises a first loop and a second loop for feeding the RF signal into the coil element of the RF coil at the first position with the first loop and at the second position with the second loop, i.e., as defined above, the first position is different from the second position, wherein the direction of the magnetic field of the RF signal at the first position is different from the magnetic field of the RF signal at the second position. Therefore, magnetic fields generated in the two different loops, respectively, have directions which are different from each other, preferably opposite to each other.

In this respect it is especially preferred that the feeding coil is designed as a figure-eight coil. In this design, one single conductor is shaped like the fig. "8", i.e. having two loops which cross each other at the crossing point of the line forming the "8". Further, both loops may be provided with a capacitor. Such a design of the feeding coil may also be called butterfly design.

Alternatively, according to a preferred embodiment of the invention, the feeding coil is designed as a decoupled dual loop coil. For decoupling the loops from each other, capacitors are provided in order to allow for opposite circulation directions in the different loops. Preferably, each loop of the decoupled dual loops is fed by a combiner network.

It may be advantageous to use more than one feeding coil. Therefore, according to a preferred embodiment of the invention, at least two feeding coils are provided wherein the at least two feeding coils are arranged and configured for feeding the RF signal into a respective coil element at different feeding positions. Especially, it is preferred that the at least two feeding coils are arranged and configured for feeding the RF signal into the RF coil at different feeding positions at one single end ring. Even more preferably, the at least two feeding coils are arranged and configured for feeding the RF signal into the one single end ring of the RF coil at different feeding positions which are opposite to each other. Further, according to a preferred embodiment, a multitude of more than two feeding coils is provided which is arranged and configured for feeding the RF signal into the RF coil at different feeding positions at the single one end ring.

Alternatively, according to a preferred embodiment of the invention, the at least two feeding coils are arranged and configured for feeding the RF signal into the RF coil at two different feeding positions at two different rungs. In this respect, it is especially preferred that the feeding coils are arranged and configured for feeding the RF signal into the two rungs of the RF coil at two different feeding positions which are opposite to each other. Further, according to a preferred embodiment of the invention, a multitude of more than two feeding coils is provided which is arranged and configured for feeding the RF signal into the RF coil at feeding positions in different rungs.

While in general the invention allows for different feeding positions, according to a preferred embodiment of the invention, the distances of the feeding positions in the rungs from the end rings are the same for all feeding positions. Preferably, the feeding coils are arranged and configured for feeding the RF signal into the RF coil at two different feeding positions which are at connection portions of the one end ring with two rungs wherein the connection portions are opposite to each other. Especially, according to a preferred embodiment of the invention, a multitude of more than two feeding coils is provided which is arranged and configured for feeding the RF signal into the RF coil at feeding positions in connection portions of the one end ring with multiple rungs, respectively. According to a preferred embodiment of the invention, at least some of the end rings and the rungs comprise at least one capacitor, respectively, wherein the feeding positions are outside the capacitors.

The invention also relates to a magnetic resonance imaging (MRI) system with a system comprising a RF coil for magnetic resonance imaging and at least one feeding coil for inductively feeding the RF coil with an RF signal according to any of the embodiments described above.

Further, the invention is directed to a method for inductively feeding a RF coil for magnetic resonance imaging with at least one RF signal, wherein the RF coil comprises conductive coil elements, and the at least one RF signal is fed into a coil element of the RF coil at a first position and at a second position, the first position being different from the second position, wherein the direction of the magnetic field of the RF signal at the first position is different from the magnetic field of the RF signal at the second position.

While the invention allows different directions of the magnetic fields, according to a preferred embodiment of the invention, the direction of the magnetic field of the RF signal at the first position is opposite to the magnetic field of the RF signal at the second position. In this way, practically a total compensation of the magnetic fields in the far field can be achieved. Further, it is especially preferred that the RF signal is fed into the RF coil at two opposite sides of the coil element. As set out in more detail further above, this allows for a very efficient feeding of the RF signal. Further embodiments of the method for inductively feeding the RF coil for magnetic resonance imaging with the least one RF signal arise from the embodiments of the system described before.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
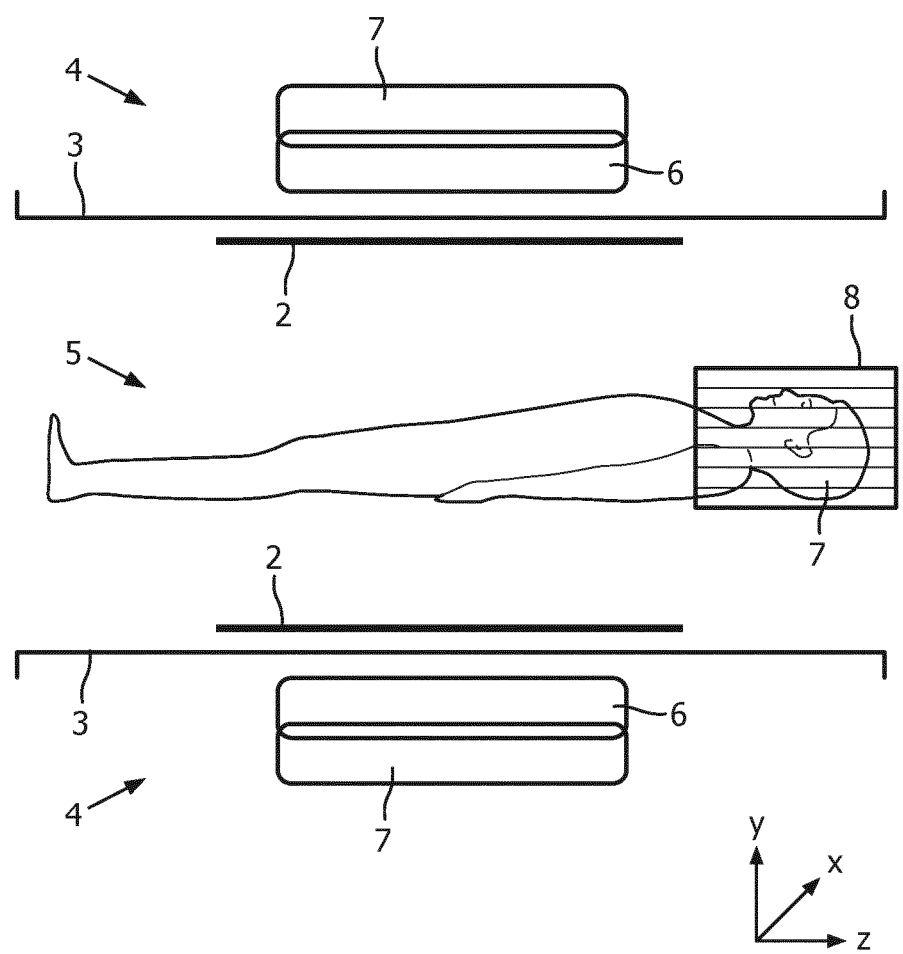
FIG. 1 depicts a longitudinal section of substantial components of magnetic resonance imaging (MRI) system according to a preferred embodiment of the invention.

FIG. 1 depicts a longitudinal section of substantial components of magnetic resonance imaging (MRI) system according to a preferred embodiment of the invention, having an axial (i.e. horizontal) examination zone 5 for introducing an examination object 1. In the following, the longitudinal direction is the direction of the z-axis or axial direction in case of such a horizontal MRI system. The examination zone 5 is surrounded by an at least substantially cylindrical whole body resonator 4 comprising an axially extending cylindrical conductor structure 2 and a cylindrical RF shield 3 which coaxially surrounds the cylindrical conductor structure 2 and is capacitively or galvanically coupled to the same.

The resonator 4 serves for transmitting RF excitation pulses (B1 field) at MR frequencies into, and/or for receiving MR signals from the examination zone 5 or a volume of interest. In FIG. 1, also a head coil 8 is shown which also comprises a conductor structure and an RF shield. Further, a gradient coil system 6 is provided by means of which the three gradient magnetic fields in the orthogonal x-, y- and z-directions are generated for the spatial selection and spatial encoding of the received MR signals emanating from the excited nuclei of interest as explained above. At the gradient coil system 6, a main magnet system 7 is arranged in a known manner for generating an essentially uniform main magnetic field (B0 field) for aligning the nuclear spins in the examination object 1.

Figure 2:
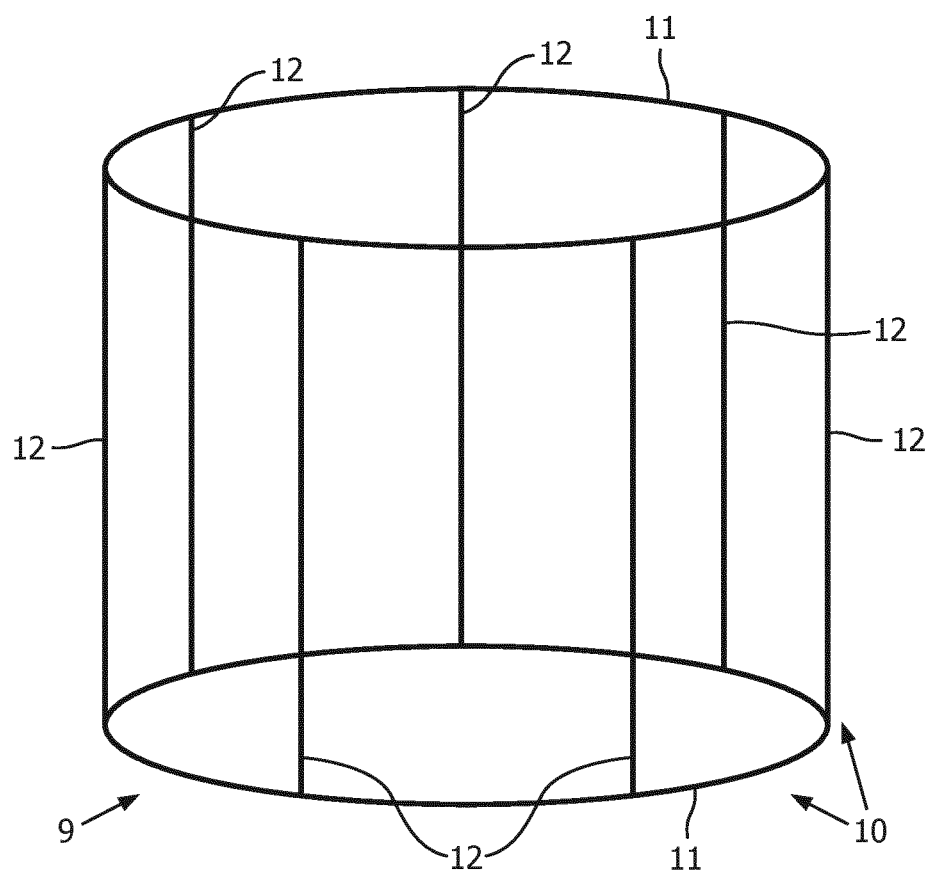
FIG. 2, schematically depicts a RF coil in the form of a birdcage coil according to a preferred embodiment of the invention.

In FIG. 2, schematically a RF coil 9 in the form of a coil according to a preferred embodiment of the invention is shown. Such a RF coil 9 according to a preferred embodiment of the invention may relate to whole body resonators 4 as well as to coils for parts of the body like the head coil 8 as described further above.

The RF coil 9 according to FIG. 2 comprises coil elements 10 including two end rings 11 comprised of two circular conductive loops which are connected with each other by a plurality of conductive straight rungs 12. The representation of the RF coil 9 in FIG. 2 is very general and does not show details like capacitors and feeding loops which are described in more detail below.

Figure 3:
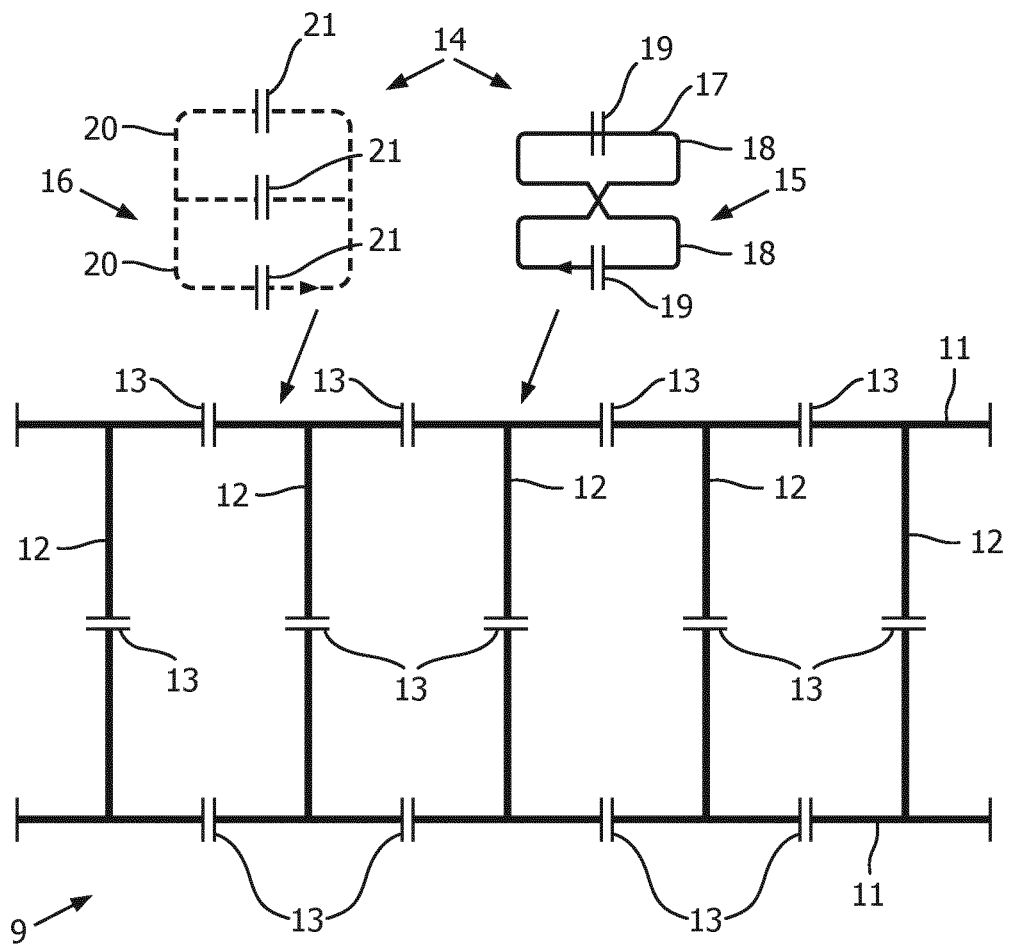
FIG. 3 depicts a flat projection of a part of a RF coil according to a preferred embodiment of the invention.

In FIG. 3 a flat projection of a part is of a RF coil 9 according to a preferred embodiment of the invention is depicted. As can be seen from FIG. 3, according to this preferred embodiment of the invention, the end rings 11 and the rungs 12 connecting the end rings 11 are provided with RF coil capacitors 13. While in the middle of each rung 12 a RF coil capacitor 13 is provided, in the middle of each connection of a rung 12 with an end ring 11 a RF coil capacitor 13 is provided, too.

Further, as exemplary depicted in FIG. 3, at least one feeding coil 14 provided for feeding an RF signal into a coil element 10 of the RF coil 9. These feeding coils 14 may be designed as a figure-eight coil 15 or as a decoupled dual loop coil 16.

In the design of the figure-eight coil 15 one single conductor line 17 is shaped like the fig. "8", i.e. having two loops 18 which cross each other at the crossing point of the line forming the "8". Further, both loops 18 are provided with a capacitor 19, respectively. Such a design of the feeding coil 14 may also be referred to as butterfly design.

Alternatively, as also shown in FIG. 3, the feeding coil 14 may be designed as a decoupled dual loop coil 16. As shown in detail, for decoupling the loops 20 of the decoupled dual loop coil 16 from each other, three capacitors 21 are provided in order to allow for opposite circulation directions of the current in the different loops 20.

Figure 4A:
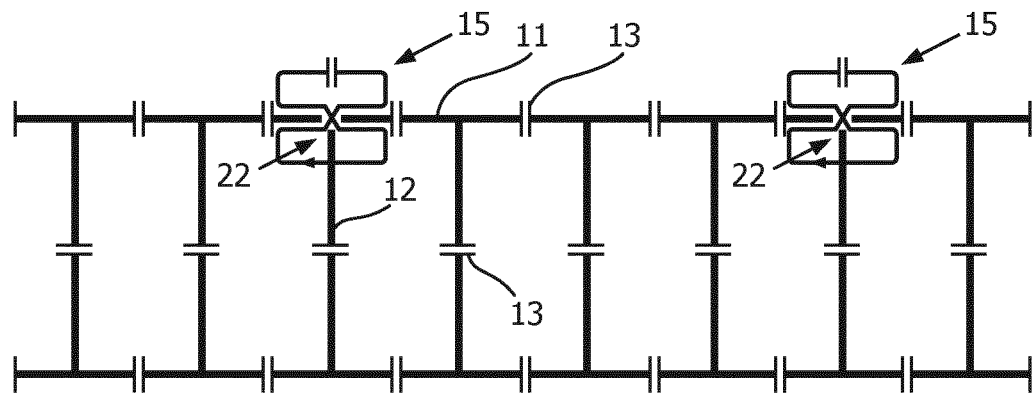
FIG. 4a depicts how inductive feeding of the RF coil is achieved with a set of two figure-eight coils 15 as feeding coils.
Figure 4B:
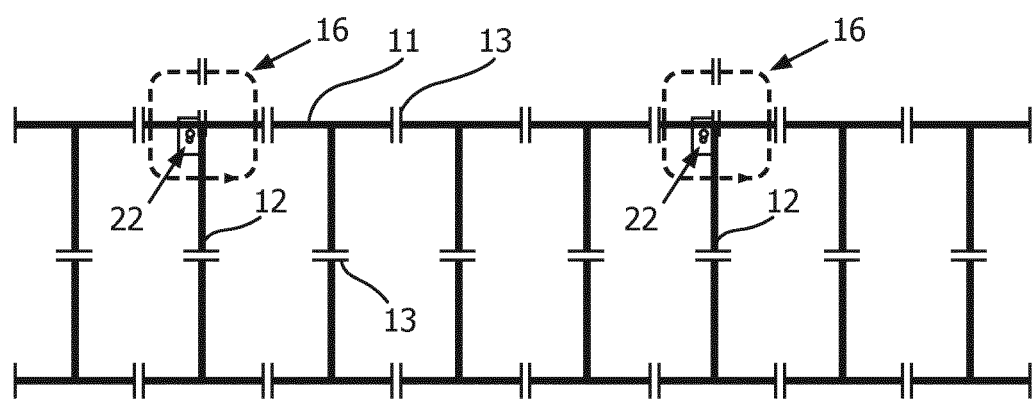
FIG. 4b depicts how inductive feeding of the RF coil is achieved with a set of two decoupled dual loop coils as feeding coils.

From FIGS. 4a and 4b it can be seen in more detail how inductive feeding of the RF coil 9 is achieved with a set of two figure-eight coils 15 (FIG. 4a) or with a set of two decoupled dual loop coils 16 (FIG. 4b) as feeding coils, respectively. The connection of RF power cables to the feeding coil 14 is not shown to keep the drawing simple.

In both cases, the feeding loops 14 are arranged at connection portions 22 of the rungs 12 with the end rings 11 in such a way that feeding the RF signal into the end ring 11 is achieved at a first position, i.e. at a first side of the end ring 11, and at a second position, i.e. at a second side of the end ring, the first side and the second side relating to one and the other (opposite) side of the end ring 11. Further, due to the design of the feeding loops 14, which have two loops 18, 20 in which the direction of the current is opposite to each other, the direction of the magnetic field of the RF signal on the one side of the end ring 11 is opposite to the direction of the magnetic field of the RF signal on the other, opposite second side of the end ring 11.

In this way, feeding the RF signal from the feeding coils 14 into the end rings 11 of the RF coil 9 can be achieved in a very effective way since the directions of the magnetic field on the one side and on the other side of the end ring, respectively, are opposite to each other and, thus, may directly match the directions of the magnetic fields of one and the other loop 18, 20 of the feeding coils 14. Moreover, in the far field, i.e. at distant locations, the magnetic fields generated by the one and the other loop 18, 20, respectively, compensate each other and, thus, reduce distortion effects.

Figure 5:
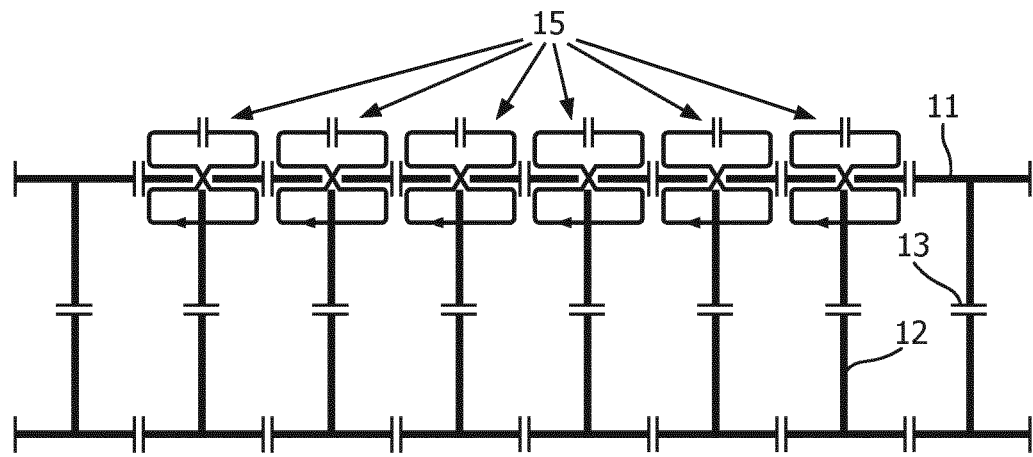
FIG. 5 shows a multiport compensated inductive feeding network using figure-eight coils.

In FIG. 5 a multiport compensated inductive feeding network using figure-eight coils 15 is shown. The arrangement of the respective figure-eight coils 15 relative to the end ring 11 and the rungs 12 is essentially the same as in FIG. 4a. However, instead of only two figure-eight coils 15 for feeding the RF signal into the RF coil 9 multiple figure-eight coils 15 are used. Due to the opposite directions of the magnetic fields in the two loops 18 of each of the figure-eight coils 15, in the far field still an almost ideal compensation is achieved.

Figure 6:
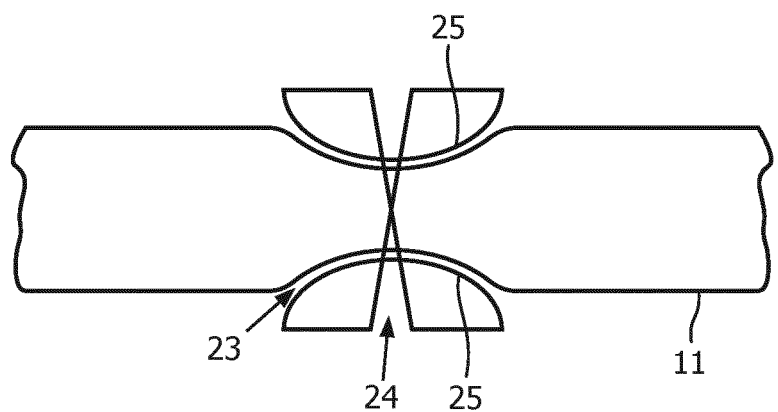
FIG. 6 shows a preferred embodiment of the invention according to which the end ring comprises a lateral contraction.

Further, FIG. 6 shows a preferred embodiment of the invention according to which the end ring 11 comprises a lateral contraction. FIG. 6 only shows the relevant part of the end ring 11 where the feeding coil 24 for coupling in the RF signal is positioned. The feeding coil 24 is designed as a special figure-eight coil wherein the outer lines of the "8" are bent inwards. This together with the fact that the feeding coil 24 is arranged for feeding the RF signal into the end ring 11 at the lateral contraction 23 makes it possible to reduce the lateral dimensions of the arrangement.

Figure 7:
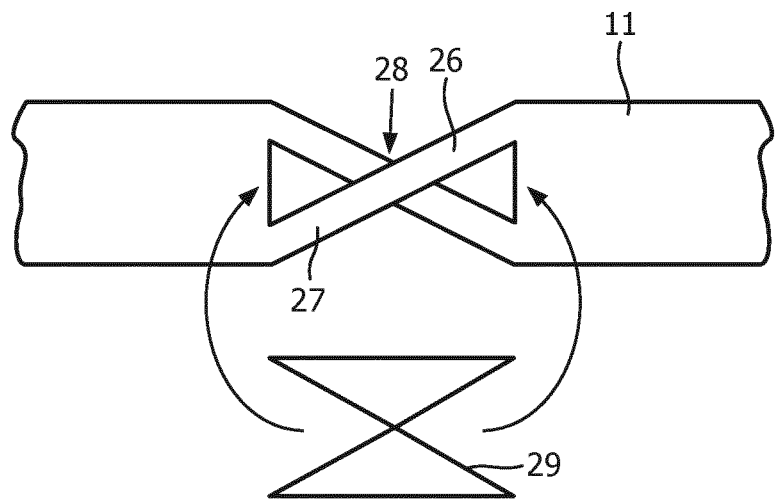
FIG. 7, shows a preferred embodiment of the invention, wherein in a section of the end ring the end ring is split into two different coil element lines.

As can further be seen from FIG. 7, according to a preferred embodiment of the invention, in a section of the end ring 11 the end ring 11 is split into two different coil element lines 26, 27, wherein the two different end ring lines 26, 27 cross each other with no galvanic contact to each other at a crossing point 28. The feeding coil 29 has a sand glass design which is a special form of above described figure-eight design, too. As indicated by two curved arrows on the right and left side of the feeding coil 29, respectively, according to the present preferred embodiment of the invention, the feeding coil 29 is arranged in such a way over the crossing point 28 of the two different end ring lines 26, 27 that it may feed the RF signal into both coil element lines 26, 27 at two opposite sides of the crossing point. This also serves for a compact design of the arrangement since at the crossing point 28 of the two different coil element lines 26, 27 the lateral dimensions of the end ring 11 are reduced, too.

Figure 8:
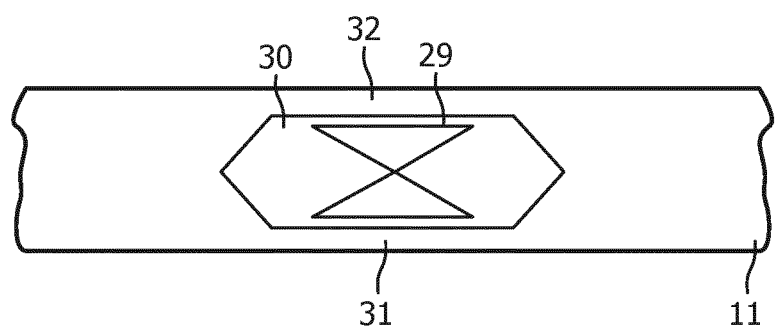
FIG. 8 schematically depicts a preferred embodiment according to which the end ring comprises a recess, which divides the end ring into two coil element lines which are spaced apart from each other.

According to another preferred embodiment of the invention, which is schematically shown in FIG. 8, the end ring 11 comprises a recess 30, which divides the end ring 11 into two coil element lines 31, 32 which are spaced apart from each other. The feeding coil 29 also has a sand glass design as described with reference to FIG. 7. The feeding coil 29 is arranged in such a way that the RF signal is fed into both coil element lines 31 and 32 inside the recess 30. Instead of feeding two RF signals with opposite magnetic field directions on opposite sides of the end ring 11, in this way a respective feeding of theses RF signals into the end ring is achieved inside the recess 30 at the one coil element line 31 and the other coil element line 32, respectively. Similar to the embodiments described above, such a solution may also serve for a compact design of the arrangement.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST examination object 1
conductor structure 2
RF shield 3
whole body resonator 4
examination zone 5
gradient coil system 6
main magnet system 7
head coil 8
RF coil 9
coil elements 10
end ring 11
rungs 12
RF coil capacitors 13
feeding coils 14
figure-eight coil 15
decoupled dual loop coil 16
single conductor line 17
loops of the figure-eight coil 18
capacitors of the figure-eight coil 19
loops of the decoupled dual loop coil 20
capacitors of the decoupled dual loop coil 21
connection portions 22
lateral contraction 23
special figure-eight feeding coil 24
outer lines of special figure-eight feeding coil 25
crossing coil element lines 26, 27
crossing point 28
sand glass design feeding coil 29
recess 30
spaced apart coil element lines 31, 32

The invention claimed is:
1. A system comprising:
a radio frequency (RF) coil for magnetic resonance imaging (MRI); and
at least one feeding coil for inductively feeding the RF coil with an RF signal which results in transmission of an RF excitation pulse for producing MRI spin excitation,
wherein the RF coil comprises conductive coil elements wherein the coil elements include two end rings comprised of two circular conductive loops which are connected with each other by a plurality of conductive straight rungs,
wherein the at least one feeding coil is configured and arranged for feeding the RF signal into a first end ring of the two end rings of the RF coil at a first position and at a second position, the first position being different from the second position,
wherein the at least one feeding coil comprises two loops and is configured to provide current in the two loops in opposite directions than each other,
wherein the at least one feeding coil is configured and arranged for feeding the RF signal into the RF coil at two opposite sides of the first end ring by arranging the two loops at a connection portion of the first end ring and one of the rungs wherein a direction of a magnetic field of the RF signal at the first position is different from the direction of the magnetic field of the RF signal at the second position.

2. The system of claim 1, wherein the direction of the magnetic field of the RF signal at the first position is opposite to the direction of the magnetic field of the RF signal at the second position.

3. The system of claim 1, wherein RF coil comprises a lateral contraction and the at least one feeding coil is configured and arranged for feeding the RF signal into the RF coil at the lateral contraction.

4. The system of claim 1, wherein in a section of the coil element, the coil element is split into two different coil element lines, the two different coil element lines crossing each other at a crossing point without galvanic contact to each other, wherein the at least one feeding coil is configured and arranged for feeding the RF signal into both coil element lines at two opposite sides of the crossing point.

5. The system of claim 1, wherein the coil element comprises a recess, wherein the recess divides the coil element into two coil element lines which are spaced apart from each other, and wherein the at least one feeding coil is configured and arranged for feeding the RF signal into both coil element lines.

6. The system of claim 5, wherein the at least one feeding coil is configured and arranged for feeding the RF signal into both lines of the RF coil inside the recess.

7. The system of claim 1, wherein the feeding coil comprises a first loop and a second loop for feeding the RF signal into the coil element of the RF coil at the first position with the first loop, and at the second position with the second loop.

8. The system of claim 6, wherein the feeding coil is designed as a figure-eight coil or wherein the feeding coil is designed as a decoupled dual loop coil.

9. The system of claim 1, comprising at least two feeding coils.

10. A magnetic resonance imaging (MRI) system comprising the system of claim 1, including the RF coil for magnetic resonance imaging and the at least one feeding coil for inductively feeding the RF coil with the RF signal.

11. The system of claim 2, wherein RF coil comprises a lateral contraction and the at least one feeding coil is configured and arranged for feeding the RF signal into the RF coil at the lateral contraction.

12. The system of claim 2, wherein in a section of the coil element, the coil element is split into two different coil element lines, the two different coil element lines crossing each other at a crossing point without galvanic contact to each other, wherein the at least one feeding coil is configured and arranged for feeding the RF signal into both coil element lines at two opposite sides of the crossing point.

13. The system of claim 2, wherein in a section of the coil element, the coil element is split into two different coil element lines, the two different coil element lines crossing each other at a crossing point without galvanic contact to each other, wherein the at least one feeding coil is configured and arranged for feeding the RF signal into both coil element lines at two opposite sides of the crossing point.

14. The system of claim 3, wherein in a section of the coil element, the coil element is split into two different coil element lines, the two different coil element lines crossing each other at a crossing point without galvanic contact to each other, wherein the at least one feeding coil is configured and arranged for feeding the RF signal into both coil element lines at two opposite sides of the crossing point.

15. The system of claim 2, wherein the coil element comprises a recess, wherein the recess divides the coil element into two coil element lines which are spaced apart from each other, and wherein the at least one feeding coil is configured and arranged for feeding the RF signal into both coil element lines.

16. A method, comprising:
providing:
- a radio frequency (RF) coil for magnetic resonance imaging (MRI), wherein the RF coil comprises conductive coil elements, wherein the coil elements include two end rings comprised of circular loops which are connected to each other by a plurality of conductive straight rungs, and
- at least one feeding coil, wherein the at least one feeding coil comprises two loops and is configured to provide current in the two loops in opposite directions than each other; and inductively feeding the RF coil with at least one RF signal which results in transmission of an RF excitation pulse for producing MRI spin excitation,
wherein the at least one RF signal is fed into a first end ring of the two end rings of the RF coil at a first position and at a second position, respectively, the first position being different from the second position,
wherein the at least one feeding coil feeds the RF signal into the RF coil at two opposite sides of the first end ring by arranging the two loops at a connection portion of the first end ring and one of the rungs, and
wherein a direction of a magnetic field of the RF signal at the first position is different from the direction of the magnetic field of the RF signal at the second position.

17. The method of claim 16, wherein the direction of the magnetic field of the RF signal at the first position is opposite to the direction of the magnetic field of the RF signal at the second position.

18. The method of claim 16, wherein the direction of the magnetic field of the RF signal at the first position is opposite to the direction of the magnetic field of the RF signal at the second position.

19. The method of claim 16, wherein RF coil comprises a lateral contraction and wherein the method comprises feeding the RF signal into the RF coil at the lateral contraction.

20. The method of claim 16, wherein in a section of the coil element, the coil element is split into two different coil element lines, the two different coil element lines crossing each other at a crossing point without galvanic contact to each other, wherein the method includes feeding the RF signal into both coil element lines at two opposite sides of the crossing point.

* * * * *